United States Patent [19]
Baum et al.

[11] Patent Number: 5,361,048
[45] Date of Patent: Nov. 1, 1994

[54] PULSE WIDTH MODULATOR HAVING A DUTY CYCLE PROPORTIONAL TO THE AMPLITUDE OF AN INPUT SIGNAL FROM A DIFFERENTIAL TRANSDUCER AMPLIFIER

[75] Inventors: Jeffery I. Baum, Scottsdale; Eric S. Jacobsen, Phoenix, both of Ariz.

[73] Assignee: Motorola, Inc., Schaumburg, Ill.

[21] Appl. No.: 113,007

[22] Filed: Aug. 30, 1993

[51] Int. Cl.$^5$ .................. H03C 3/00; G08C 19/00; G08C 19/16; H03K 7/08
[52] U.S. Cl. .................. 332/109; 332/110; 328/1; 340/870.24
[58] Field of Search .............. 332/109, 110, 111, 118, 332/150; 307/265; 73/37; 324/609–611, 158 P, 161, 162, 176, 665, 672, 679, 705; 328/146, 147, 148, 149, 1–6; 330/174; 340/870.19, 870.21, 870.24

[56] References Cited

U.S. PATENT DOCUMENTS

| | | | |
|---|---|---|---|
| 3,693,113 | 9/1972 | Glasser et al. | 332/110 |
| 4,257,034 | 3/1981 | Wilkinson | 364/431.12 X |
| 4,264,898 | 4/1981 | Barman et al. | 364/431.12 X |
| 4,266,274 | 5/1981 | Barman | 364/431.12 X |
| 4,734,842 | 3/1988 | Hantke | 307/265 X |
| 4,736,391 | 3/1988 | Siegel | 328/149 X |
| 5,223,742 | 6/1993 | Schumacher | 307/265 X |

OTHER PUBLICATIONS

Griffiths, D.; "Resistance Comparator"; *Wireless World*; Jul., 1975; pp. 331–333.

*Primary Examiner*—David Mis
*Attorney, Agent, or Firm*—Robert D. Atkins

[57] ABSTRACT

A pulse width modulator generates a linear sawtooth ramp waveform from a pulse signal to compare against an amplified input signal derived from a transducer output voltage signal. A first circuit generates the linear ramp waveform in response to the pulse signal. First and second amplifiers receive the differential transducer signal and provide the amplified input signal to one input of a comparator. The comparator has another input receiving the linear ramp waveform, and an output for providing a pulse width modulated output signal having a duty cycle proportional to the differential transducer signal. If the amplified input signal is greater than the sawtooth ramp then the output signal of the pulse width modulator goes to one state; otherwise, the output signal goes to an opposite state. The pulse width of the output signal is thus linearly proportional to the amplitude of the transducer output signal. A microcontroller uses a single time base to generate the pulse signal and measure the pulse width of the output signal to determine the reading from the transducer.

7 Claims, 2 Drawing Sheets

PULSE WIDTH MODULATOR HAVING A DUTY CYCLE PROPORTIONAL TO THE AMPLITUDE OF AN INPUT SIGNAL FROM A DIFFERENTIAL TRANSDUCER AMPLIFIER

BACKGROUND OF THE INVENTION

The present invention relates in general to pulse width modulators and, more particularly, to pulse width modulator for performing voltage to duty cycle conversion.

Many circuit applications require signals to be transmitted over long distances and through noisy environments. In one example where a pressure sensor transducer monitors a pressurized system or other pressure source, the transducer converts pressure to an amplitude varying analog voltage signal. The analog signal is typically transmitted to a microcontroller to process the pressure status and possibly make appropriate adjustments to the system. The microcontroller may be located some distance from the pressure sensor, or possibly in a noisy industrial environment. Consequently, the analog signal is often subject to noise interference which can effect its instantaneous amplitude. Any noise introduced onto the analog signal creates misrepresentations of the actual pressure thereby causing the microcontroller to mis-report or mis-correct the system.

A common solution has been to use a voltage controlled oscillator to convert the amplitude varying analog signal into a frequency varying signal. The frequency varying signal is much less subject to common low frequency noise in the industrial setting. Filters may be used at the receiving end to remove any low frequency noise. Most microcontrollers are digital in nature thereby requiring the frequency varying signal to be converted to digital form before use. However for good performance, the transducer voltage to frequency conversion circuitry tends to be complex and expensive.

Hence, a need exists to convert an analog signal to a form that is robust to noisy transmission while requiring minimal re-conversion before end use.

DETAILED DESCRIPTION OF THE PREFERRED EMBODIMENT

Figure 1:
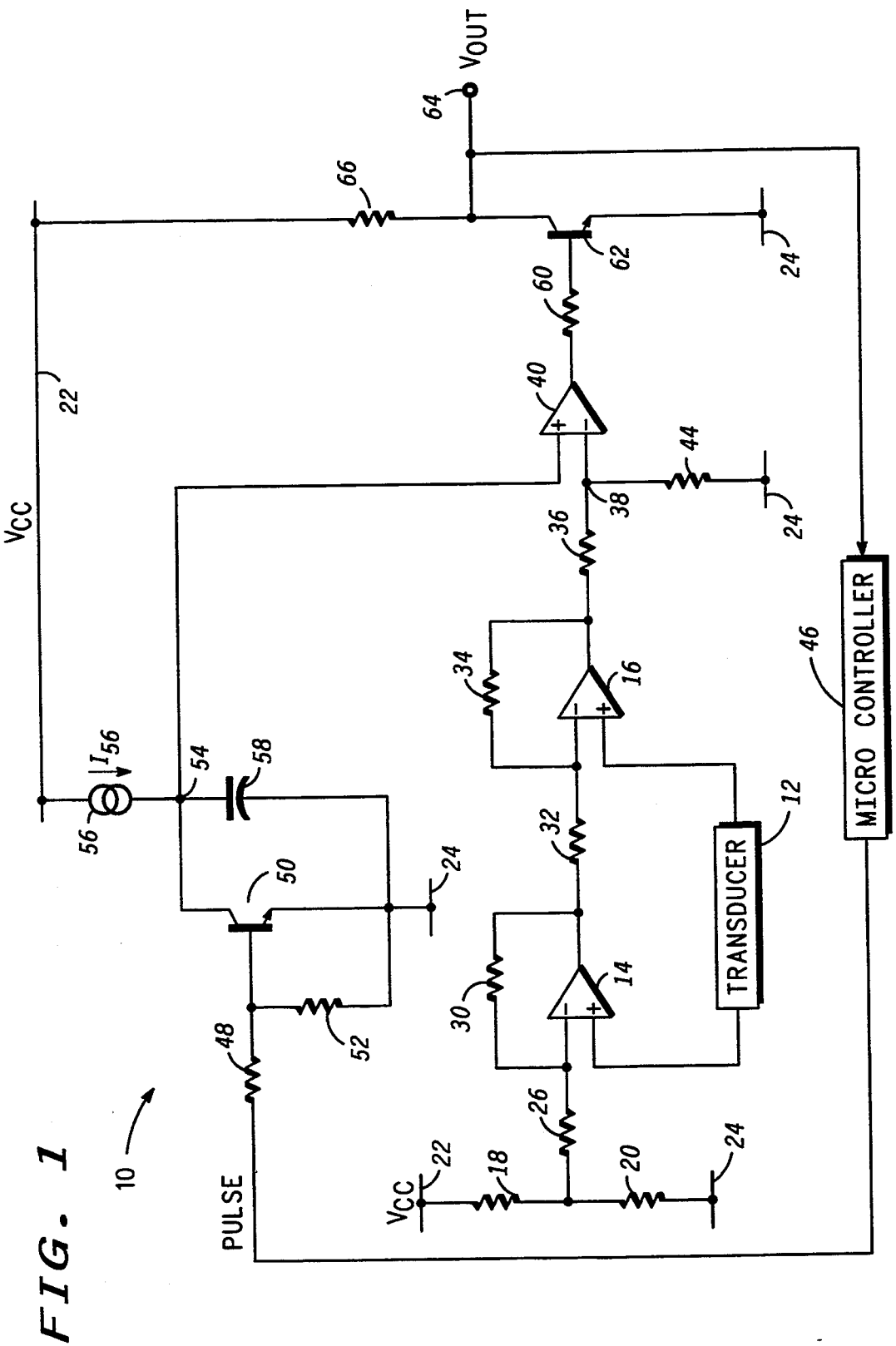
FIG. 1 is a schematic and block diagram illustrating a pulse width modulator.

A pulse width modulator 10 is shown in FIG. 1 suitable for manufacturing as an integrated circuit using conventional integrated circuit processes. A transducer 12 represents a voltage source with differential outputs coupled to the non-inverting inputs of operational amplifiers (op amp) 14 and 16. Transducer 12 may for example represent a pressure sensor, e.g. Motorola part number MPX2100DP, for monitoring the pressure of a pressurized system (not shown). Another example for transducer 12 may include a temperature sensor. Op amps 14 and 16 provide gain to increase the magnitude of the differential signal from transducer 12 while converting it to single-ended form at the output of op amp 16. Resistors 18 and 20 are serially coupled between power supply conductor 22 operating at a positive potential $V_{CC}$ such as 5.0 volts and power supply conductor 24 operating at ground potential. The value of resistors 18 and 20 may be selected at 12.1K ohms and 300 ohms, respectively, to set up a voltage divider reference through resistor 26 to the inverting input of op amp 14. Resistor 20 may be used as an offset trim to calibrate the output signal of op amp 16 for zero pressure.

A feedback resistor 30 is coupled between the output of op amp 14 and its inverting input for providing gain. The output of op amp 14 is also coupled to the inverting input of op amp 16 by way of resistor 32. The value of resistors 26, 30 and 32 may be selected at 20K ohms, 137 ohms and 137 ohms, respectively. A feedback resistor 34 selected at say 20K ohms is coupled between the output of op amp 16 and its inverting input also for gain. An 8.45K ohm resistor 36 is coupled between the output of op amp 16 and node 38 at the inverting input of comparator 40. Resistor 44 selected at say 10K ohms is coupled between node 38 and power supply conductor 24. Resistors 36 and 44 operate as a voltage divider to reduce the amplitude of the single-ended signal coming from op amp 16. The nominal voltage at node 38 may thus be tuned by adjusting resistor 44.

A pulse signal from an output compare channel of microcontroller 46 is applied through resistor 48 to the base of transistor 50. The microcontroller determines the pulse width and frequency of the pulse signal. Microcontroller 46 may represent Motorola 8-bit microcontroller part number MC68HC05. Resistor 52 is coupled between the base of transistor 50 and power supply conductor 24. The value of resistors 48 and 52 may be selected at 4.75K ohms and 22.1K ohms, respectively. A node 54 is formed at the collector of transistor 50 receiving constant current $I_{56}$, say 10 milliamps, from current source 56. Capacitor 58 with a value of say 1.0 μf is coupled between node 54 and power supply conductor 24. A constant current source is important to provide a linear voltage ramp across capacitor 58, i.e. $I=C*dV/dt$. One possible selection for current source 56 is Motorola part number MDC4010A.

Figure 2:
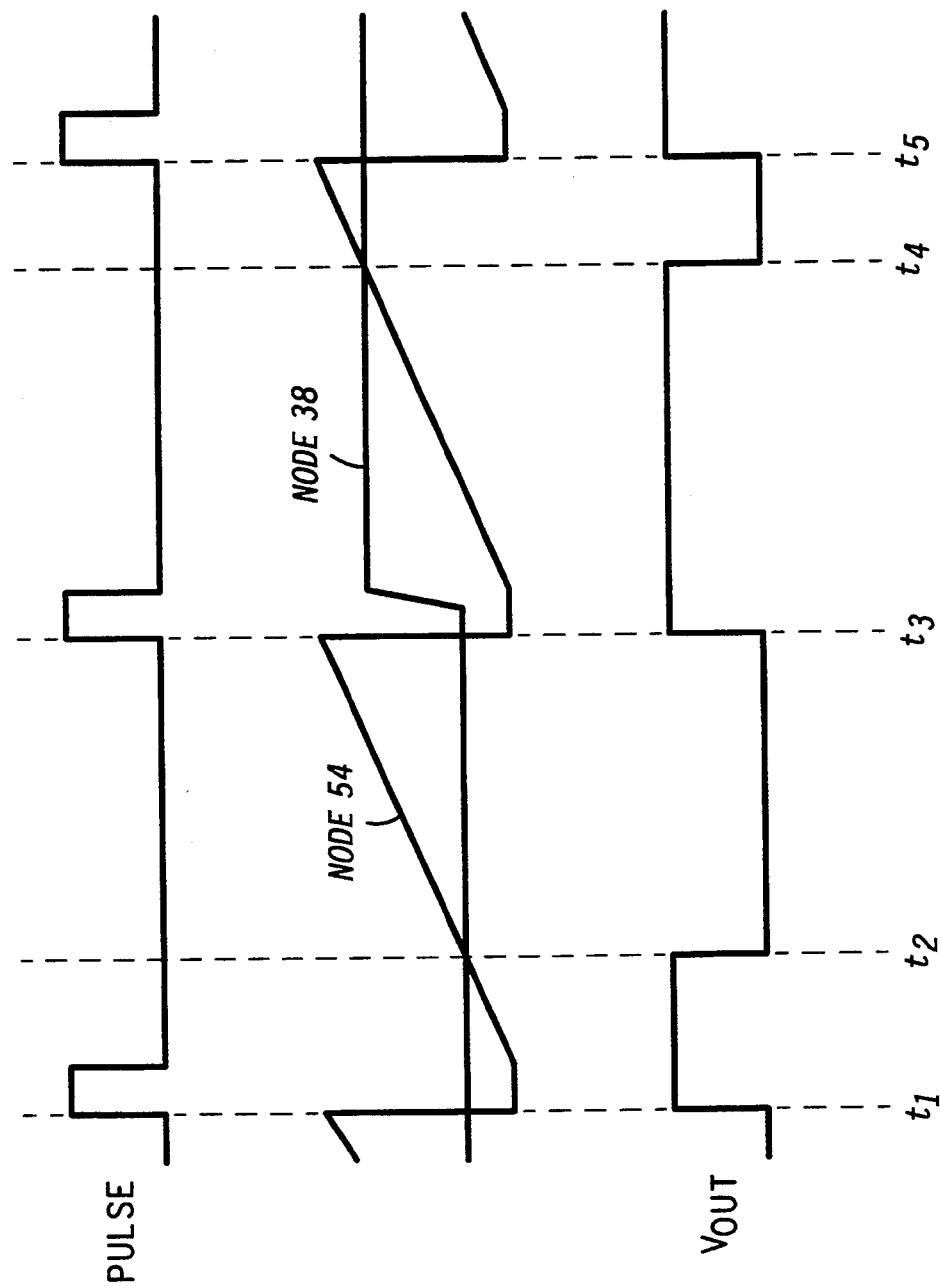
FIG. 2 is a waveform diagram useful in explaining the present invention.

When the pulse signal is low, transistor 50 is turned off and current source 56 charges capacitor 58 in a linear fashion as shown in FIG. 2. When the pulse signal goes high, for example at time $t_3$, transistor 50 turns on and goes into saturation to discharge capacitor 58. Thus, node 54 develops the sawtooth ramp waveform as shown in FIG. 2 which is applied to the non-inverting input of comparator 40. With proper selection of components and programming via microcontroller 46, the slope, frequency and DC offset of the sawtooth ramp waveform may be customized.

Between times $t_1$ and $t_2$, the voltage at node 38 is greater than the sawtooth waveform at node 54. Comparator 40 provides a low signal through resistor 60 to the base of transistor 62 turning it off. The output voltage $V_{OUT}$ at node 64 goes high through resistor 66 as shown in FIG. 2. At time $t_2$, the voltage at node 54 exceeds that at node 38 causing the output of comparator 40 to change to a high state and turn on transistor 62. Transistor 62 sinks current from resistor 66 through its emitter to power supply conductor 24 causing the output voltage $V_{OUT}$ to go low. The pulse signal at time $t_3$ begins the cycle again by discharging capacitor 58 at node 54 and switching the output of comparator 40 to a low state thus turning off transistor 62.

Assume the differential output signal from transducer 12 changes level just after time $t_3$ due to change in the system pressure. The voltage at node 38 increases accordingly and changes the threshold for the sawtooth waveform. Now the voltage at node 54 does not exceed the voltage at node 38 until time t₄. The output signal of comparator 40 goes high after time t₄ thereby turning on transistor 62. The output signal $V_{OUT}$ goes low until time t₅ at the beginning of the next cycle. Thus, the smaller the differential output voltage of transducer 12, the shorter the pulse width of the output signal $V_{OUT}$. The greater the differential output voltage of transducer 12, the longer the pulse width of the output signal $V_{OUT}$. The pulse width of the output signal $V_{OUT}$, and its duty cycle (percentage high time to total period), are thus proportional to the output voltage level of transducer 12, e.g. the system pressure.

Pulse width modulator 10 has performed a voltage to duty cycle conversion. The duty cycle of the output signal $V_{OUT}$ may be made inversely proportional to the output signal level of transducer 12 by adding another inverter stage, or by switching the inputs of comparator 40. The pulse signal frequency as generated by microcontroller 46 determines the frequency of the sawtooth waveform which is the same as the output signal frequency $V_{OUT}$.

Microcontroller 46 may be implemented as Motorola part number MC68HC05, assuming it is a version with an input capture channel capable of detecting high-low and low-high edge transitions of the output signal $V_{OUT}$. Microcontroller 46 also includes an output compare channel for generating the PULSE train to drive transistor 50. Detecting edge transitions as opposed to detecting analog voltage levels provides improved noise immunity in adverse environments. Thus, microcontroller 46 may directly measure the output signal level of transducer 12 as the duty cycle of the output signal $V_{OUT}$. The present invention is also useful in microcontroller-based systems that do not employ an analog-to-digital converter.

Another advantage of the present invention is that a single time base controls microcontroller 46 to generate the pulse signal to control linear ramp circuit 48–58 and to measure the pulse width modulated signal at node 64. Thus, the frequency of the output signal $V_{OUT}$ is programmable and may be easily modified as per the application. Moreover, the microcontroller allows the transducer to be calibrated under software control.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A pulse width modulator, comprising:
   first means coupled for receiving a pulse signal and for generating a linear ramp waveform in response to said pulse signal;
   a first amplifier having first and second inputs and an output, said first input being coupled for receiving a reference potential, said second input being coupled for receiving a first differential transducer signal;
   a first resistor coupled between said output of said first amplifier and said first input of said first amplifier;
   a second amplifier having first and second inputs and an output, said first input being coupled to said output of said first amplifier, said second input being coupled for receiving a second differential transducer signal;
   a second resistor coupled between said output of said second amplifier and said first input of said second amplifier;
   a comparator having first and second inputs and an output, said first input being coupled for receiving said linear ramp waveform, said second input being coupled to said output of said second amplifier, said output being coupled for providing a pulse width modulated output signal having a duty cycle proportional to said first and second differential transducer signals.

2. The pulse width modulator of claim 1 further including:
   a first transistor having a base, an emitter and a collector, said base being coupled for receiving said pulse width modulated output signal, said emitter being coupled to a first power supply conductor; and
   a third resistor coupled between said collector of said first transistor and a second power supply conductor.

3. The pulse width modulator of claim 2 wherein said first means includes:
   a second transistor having a base, an emitter and a collector, said base being coupled for receiving said pulse signal, said emitter being coupled to said first power supply conductor, said collector being coupled to said first input of said comparator at a first node;
   a current source having an output for providing a constant current into said first node; and
   a capacitor coupled between said first node and said first power supply conductor.

4. A pulse width modulator, comprising:
   first means coupled for receiving a pulse signal and for generating a linear ramp waveform in response to said pulse signal;
   second means coupled for receiving a differential input signal and for amplifying said differential input signal for providing an amplified input signal, said second means including,
   (a) a first amplifier having first and second inputs and an output, said first input being coupled for receiving a reference potential, and
   (b) a second amplifier having first and second inputs and an output, said first input being coupled to said output of said first amplifier, said second inputs of said first and second amplifiers being coupled for receiving said differential input signal;
   a comparator having first and second inputs and an output, said first input being coupled for receiving said linear ramp waveform, said second input being coupled to said output of said second amplifier, said output being coupled for providing a pulse width modulated output signal having a duty cycle proportional to said differential input signal; and
   a microcontroller having an output coupled for providing said pulse signal and having an input coupled for receiving said pulse width modulated output signal for determining an amplitude of said input signal based on a duty cycle of said modulated output signal.

5. The pulse width modulator of claim 4 further including:
   a first transistor having a base, an emitter and a collector, said base being coupled for receiving said pulse width modulated output signal, said emitter being coupled to a first power supply conductor; and a first resistor coupled between said collector of said first transistor and a second power supply conductor.

6. The pulse width modulator of claim 5 wherein said first means includes:

a second transistor having a base, an emitter and a collector, said base being coupled for receiving said pulse signal, said emitter being coupled to said first power supply conductor, said collector being coupled to said first input of said comparator at a first node;

a current source having an output for providing a constant current into said first node; and a capacitor coupled between said first node and said first power supply conductor.

7. The pulse width modulator of claim 6 wherein said second means includes:

a second resistor having a first terminal coupled for receiving said reference potential and having a second terminal coupled to said first input of said first amplifier;

a third resistor coupled between said output of said first amplifier and said first input of said first amplifier;

a fourth resistor coupled between said output of said first amplifier and said first input of said second amplifier; and a fifth resistor coupled between said output of said second amplifier and said first input of said second amplifier.

* * * * *